(12) United States Patent
Larson

(10) Patent No.: US 7,248,355 B2
(45) Date of Patent: Jul. 24, 2007

(54) USING SPECIAL VISIBILITY MATERIALS PROXIMATE CANDIDATE COMPONENT LOCATIONS TO ENHANCE RECOGNITION

(75) Inventor: Thane Michael Larson, Roseville, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 15 days.

(21) Appl. No.: 10/939,754

(22) Filed: Sep. 13, 2004

(65) Prior Publication Data

US 2006/0054338 A1    Mar. 16, 2006

(51) Int. Cl.
*G01N 21/00* (2006.01)
(52) U.S. Cl. ............... 356/239.1; 250/459.1; 250/461.1
(58) Field of Classification Search ........... 250/461.1, 250/458.1, 459.1; 356/239, 239.1
See application file for complete search history.

(56) References Cited

U.S. PATENT DOCUMENTS

| | | | |
|---|---|---|---|
| 4,400,618 A | * | 8/1983 | Bupp et al. ............... 250/302 |
| 4,697,923 A | * | 10/1987 | Jones et al. ............... 356/237.5 |
| 4,963,752 A | | 10/1990 | Landis |
| 5,805,533 A | | 9/1998 | Daigle et al. |
| 6,187,417 B1 | | 2/2001 | Farquhar |
| 6,337,375 B1 | | 1/2002 | Johansson |
| 6,698,085 B2 | | 3/2004 | Stevenson et al. |

OTHER PUBLICATIONS

GB Patent Office, Patents Act 1977: Search Report under Section 17(5), Nov. 25, 2005, 4 pages.

* cited by examiner

*Primary Examiner*—Hung V. Ngo

(57) ABSTRACT

The invention in one implementation encompasses the use of special visibility material to enhance the ability of computer-aided visual inspection machines to detect errors in placement or orientation of components mounted to a printed circuit board. In another implementation, the visibility of labels to a repair technician is enhanced by using indicia formed using special visibility material disposed in a housing which substantially restricts the penetration outside ambient light into the interior of the housing.

10 Claims, 4 Drawing Sheets

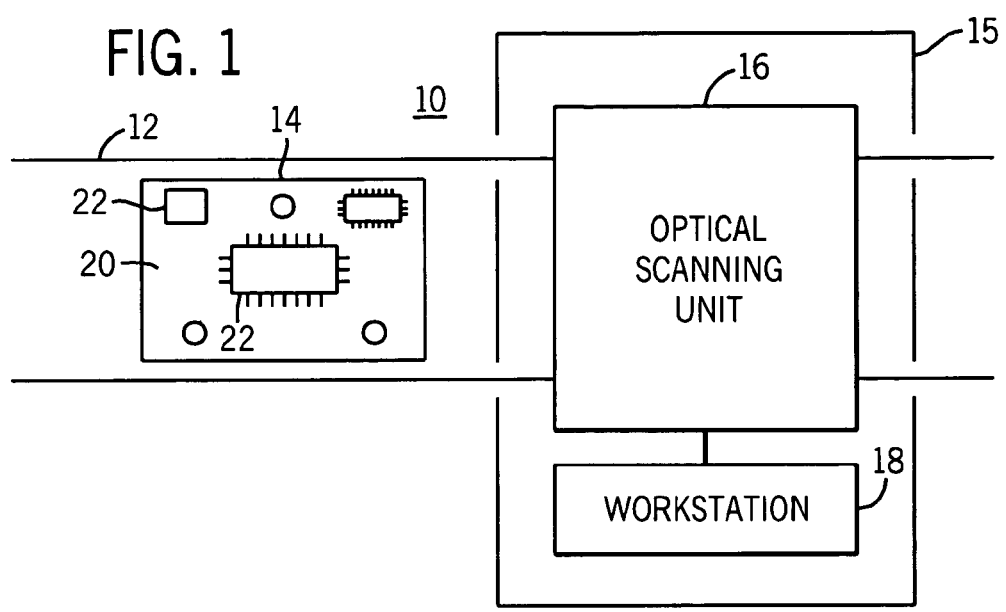
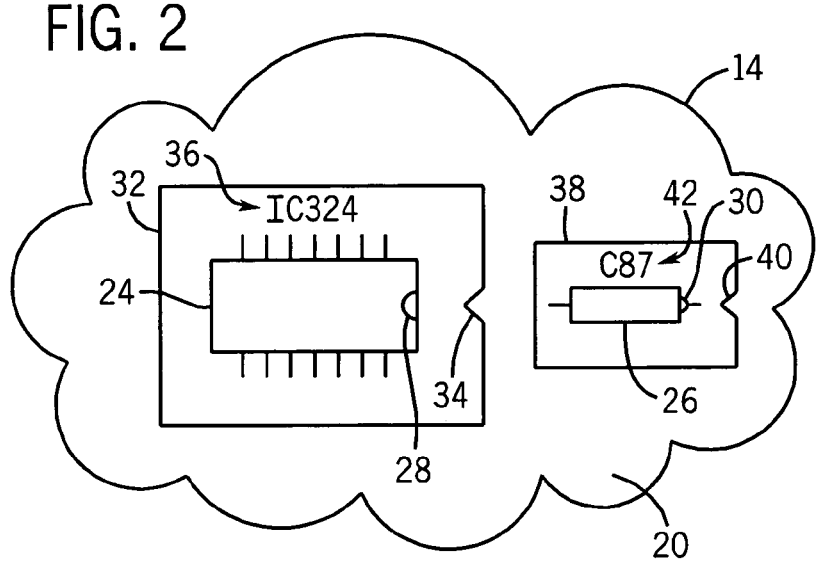
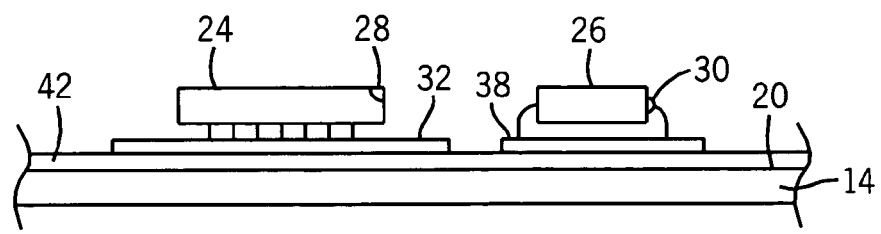

USING SPECIAL VISIBILITY MATERIALS PROXIMATE CANDIDATE COMPONENT LOCATIONS TO ENHANCE RECOGNITION

BACKGROUND

This invention generally relates to the manufacture and repair of electronic devices and is especially, but not exclusively, adapted for use with printed circuit boards. More specifically, it relates to the use of special visibility materials to identify components, component placement and orientation, and/or provide information about the components and the electronic device containing the components.

Printed circuit boards are used to support a variety of electronic components and interconnect the components using copper connection paths. The outside top surface of the printed circuit board is sealed with paint or another material to prevent tarnishing of the copper paths disposed on the top surface. Labels identifying components may be silk screened onto the printed circuit board at locations adjacent the corresponding components. A color of paint is used for the labels that will contrast with the paint utilized to seal the overall top surface. For example, white labels, e.g. "IC123" identifying a specific integrated circuit, on a green background are used.

Other labels are also utilized inside the housing or chassis of an electronic device. Information such as text or graphic symbols may be contained on plastic or paper labels that are affixed to components or directly to the chassis or case of the electronic device. The information may express warnings to a user or technician, or may provide instructions relating to the servicing or repair of a component or module of the electronic device.

Computer-aided visual inspection machines are used to search for defects during the manufacture of printed circuit boards. The machines attempt to locate components that were erroneously not mounted to the printed circuit board, and components that are mounted to the printed circuit board at an incorrect location or orientation. An image of a properly assembled printed circuit board of the same type being manufactured may be stored in memory as a reference. An image of the manufactured circuit board is compared to the reference image in an attempt to locate such defects by evaluating differences in the images at various locations.

Such uses and functions give rise to needs that are discussed at the beginning of the Detailed Description section in view of the implementations of the present invention.

SUMMARY

The invention in one implementation encompasses an electronic assembly having a printed circuit board and a first component mounted to it. A first area of special visibility material is disposed on the printed circuit board adjacent the first component so that portions of the first area are visible around the first component.

Another implementation of the invention encompasses a method for locating errors in component placement on a printed circuit board. A computer-aided visual inspection machine is used to determine the placement and orientation of components on the printed circuit board. The contrast of visual images as sensed by the computer-aided visual inspection machine is enhanced between components and the printed circuit board by disposing special visibility material on the printed circuit board in regions surrounding the components. The enhanced contrast visual images of a printed circuit board being evaluated are compared to stored visual images of a reference printed circuit board of the same type having correct component placement and orientation. Scores reflecting the difference between the compared images of the printed circuit board being evaluated and images associated with the reference printed circuit board are generated. A first component on the evaluated board is determined to have a placement or orientation error if a first score corresponding to the difference between the image of the first component on the printed circuit board being evaluated and image of the first component on the reference printed circuit board exceeds a predetermined threshold value.

DESCRIPTION OF THE DRAWINGS

Features of exemplary implementations of the invention will become apparent from the description, the claims, and the accompanying drawings in which:

FIG. 1 illustrates an exemplary implementation of a computer-aided visual inspection machine being utilized in combination with a printed circuit board with indicia formed with special visibility material in accordance with the present invention.

FIG. 2 is a top view of an enlarged portion of a printed circuit board with indicia formed with special visibility material in accordance with an exemplary implementation of the present invention.

FIG. 3 is a side view of the portion of the printed circuit board as seen in FIG. 2.

DETAILED DESCRIPTION

Figure 4:
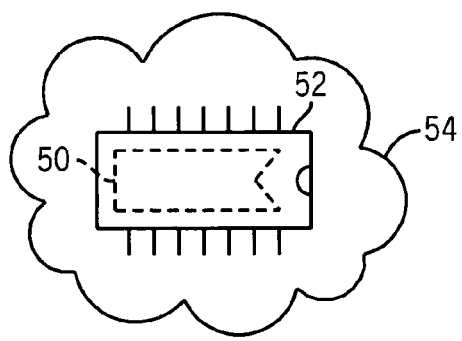
FIG. 4 is a top view of an enlarged portion of a printed circuit board with indicia formed with special visibility material in accordance with another exemplary implementation of the present invention.

Referring to the Background section above, it is recognized in accordance with an aspect of the present invention that it is beneficial to enhance optical contrast between components mounted on a printed circuit board and the printed circuit board itself. Applying a special visibility material to the printed circuit board at areas surrounding the area occupied by components will enhance the optical contrast between components and the printed circuit board and enhance the accuracy of measurements made by a computer-aided visual inspection machine or facilitate making manual visual inspections. Visible light radiating from the special visibility material surrounding the opaque components will make the components standout as relatively darker areas within a lighter area. Preferably the special visibility material is applied to the printed circuit board beneath the locations where components are to be placed so that a missing component can be more easily recognized as consisting of a substantially uniform lighter area at the location of the component with no interior darker area that should have been present if the component had been inserted. Additionally, for components in which orientation on the printed circuit board is important, a key can be formed in the special visibility material near the end of the component with a corresponding keyed feature. This makes locating a component that is inserted with the incorrect orientation straightforward since the key in the special visibility material identifies the correct orientation.

Another aspect of the present invention resides in recognizing that servicing of an electronic device by a technician may be required to be done in a relatively low light environment, i.e. relatively low light may be present in the interior of the electronic device where a technician is required to make observations. In such circumstances, the use of a special visibility material, especially a luminescent material, in labels identifying the various components and modules within the electronic device makes reading the labels and hence identifying different components and modules easier for the repair technician. The labels may be screened printed with luminescent material on the surface of a printed circuit board adjacent the respective components, or may consist of the use of luminescence material on labels made of paper or plastic that are attached to modules, components or interior locations inside the electronic device in order to convey appropriate information.

FIG. 1 illustrates an assembly 10 that may comprise part of an initial manufacturing or repair facility for printed circuit boards. The exemplary assembly 10 includes a moving conveyor belt 12 that carries a printed circuit board 14 to a computer-aided visual inspection machine 15 that includes an optical scanning unit 16 and a workstation 18. The printed circuit board 14 has mounted to the top surface 20 a plurality of different types of components 22.

As will be explained in more detail below with respect to FIGS. 2-3, the circuit board contains at least portions of "special visibility" materials. As used herein "special visibility materials" means materials that are capable of generating an uncommon light reflection or light generation such as luminescent material like phosphorus in low visible light environments, blacklight sensitive material that generates a significant visible light image when subjected to a source of blacklight, and infrared sensitive material that generates a significant visible light image when subjected to a source of infrared light. The use of a special visibility material, especially a blacklight sensitive material, will enhance the ability of the computer-aided visual inspection machine to locate a missing component and determine whether such a missing component constitutes a defect or is intentionally not present on the printed circuit board 14 when subjected to a blacklight source 17. The optical scanning unit 16 contains an imaging system that senses light intensity and may also sense colors. The image information is converted into digital data that represents the scanned image and is stored for further processing by workstation 18. An image of the same type of printed circuit board containing properly assembled components will have been previously scanned and stored in memory to form the basis of image comparisons with newly manufactured printed circuit boards or printed circuit boards to be repaired. An image of a predefined area surrounding one or a cluster of components of the reference printed circuit board is compared to the image of the same predefined area of the printed circuit board being examined. Various software algorithms are available to make this comparison. For example, the predefined areas may be subdivided for further granularity into an X-Y grid in which corresponding cells of the grid are compared for light intensity and/or color. The comparisons for each of the cells in the grid between the reference cell and the examined cell may be combined to form a total difference score. The value of the total difference score is compared to a predetermined threshold score for the predefined area and forms at least one criteria for determining the existence of a defect, i.e. a measure of image differences. After the whole printed circuit board has been evaluated, the workstation 18 provides an output that identifies any areas that were determined to have a defect thereby enabling a technician to further inspect the identified areas/components and correct any defects.

FIG. 2 shows an enlarged portion of printed circuit board 14 in order to better explain an exemplary use of special visibility material. An integrated circuit 24 identified as "IC324" and a tubular capacitor 30 identified as "C87" are components in the enlarged portion. The integrated circuit 24 includes a notch 28 and the electrolytic capacitor 26 includes a protrusion 30 that serve as visual keys identifying an orientation for the components. The illustrative components will not function properly if inserted with the wrong orientation. An area 32 (a component candidate mounting area) of special visibility material, preferably blacklight sensitive material, is disposed on the top surface 20 of the printed circuit board 14 to substantially surround integrated circuit 24. The area 32 is preferably disposed underneath the body of the integrated circuit 24. Since the integrated circuit 24 is opaque and typically a dark color, the light radiated from the blacklight sensitive material while being irradiated by a source of blacklight provides a high contrast relative to the integrated circuit. Should the integrated circuit 24 be not present, i.e. not installed at this location, the light radiated from substantially all of area 32 will provide an easily identifiable, relatively uniform, bright area. This enables components that are not present to be quickly and easily identified.

A key 34 in area 32 of the special visibility material is preferably disposed adjacent the key 28 associated with integrated circuit 24. The key 34 may consist of a notch or absence of special visibility material, or may consist of an outward projection of special visibility material beyond the rectangular outline of area 32. The key 34 provides information that can be discerned by the computer-aided visual inspection machine or repair technician indicating the required orientation of the corresponding component.

Additionally, a label 36 providing the identification "IC324" is preferably contained within area 32. The label preferably consists of letters or symbols form of the material that will have a high contrast as compared with the special visibility material. For example, the letters may comprise an absence of special visibility material, such as formed by etching, so that the underlying darker background color is visible. Alternatively, the letters may be formed by applying paint over the special visibility material that provides sufficient contrast to be easily recognized. The label provides information that can be discerned by the computer-aided visual inspection machine or repair technician indicating the specific component associated with the location.

A similar treatment regarding the use of special visibility material is utilized with respect to capacitor 26. An area 38 of special visibility material substantially surrounds the body of the capacitor 26, including beneath the capacitor. A notched key 40 in the special visibility material marks the orientation of the capacitor consistent with key 30. A label 42 provides the identification "C87".

FIG. 3 shows a side view of the portion of the printed circuit board is shown in FIG. 2. On the top 20 of printed circuit board 14 is a protective coating of material 42, such as paint, that covers the entirety of the top surface of the printed circuit board. The areas 32 and 38 of special visibility material in the illustrative embodiment are disposed on top of material 42.

Figure 5:
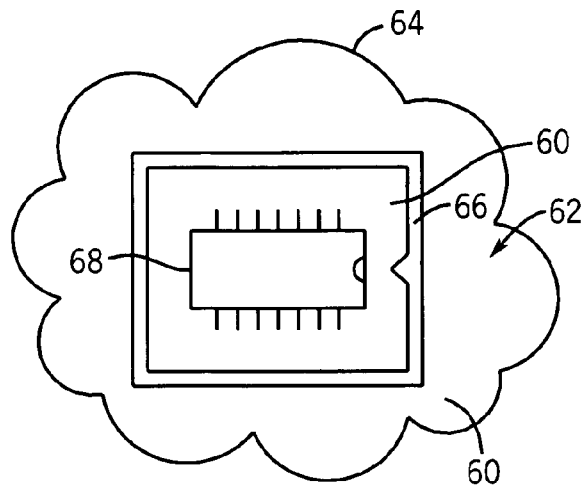
FIG. 5 is a top view of an enlarged portion of a printed circuit board with indicia formed with special visibility material in accordance with a further exemplary implementation of the present invention.

FIGS. 4 and 5 show different ways to enhance visual inspections using special visibility material. In FIG. 4 the special visibility material 50 is disposed only underneath the bodies of the components 52 on printed circuit board 54 so that the radiated light from such an area of special visibility material would immediately signal the absence of a component that should be present. In FIG. 5 the special visibility material 60 is disposed across the entirety of the top surface 62 of the printed circuit board 64 with lines 66 being etched into or covered up by ordinary paint in order to define frames associated with each component 68. Alternatively, a second special visibility material radiating a different color or intensity of light could be disposed underneath the bodies of the components so as to be contrasted with a first special visibility material that would be visible surrounding the component. Depending upon the application, special visibility material may be utilized that emits visible light primarily when subjected to a special light source, such as a source of infrared light. This may be particularly useful when it is desired to convey information only to an authorized repair technician who would be equipped with such a light source and may be especially useful in handling and tracking repaired assemblies. These different ways of utilizing special visibility material are offered merely by way of example and are not intended to be a listing of all possible variations.

Figure 6:
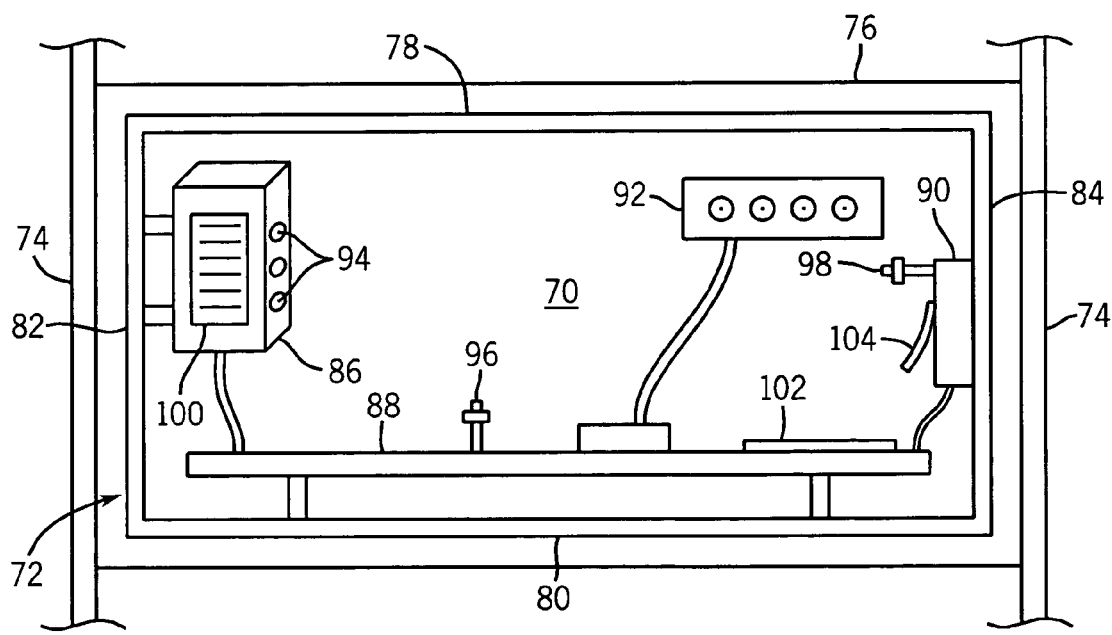
FIG. 6 is a rear elevational view of a shelf in an electronic rack with the rear panel removed in order to show the interior of a chassis in which indicia formed with special visibility material is used in accordance with an exemplary implementation of the present invention.

In FIG. 6, an electronic device 70 is mounted in a shelf 72 of a rack including vertical side supports 74. In this example the rear panel has been removed by a repair technician to gain access to the electronic device 70 in order to locate a failure associated with the electronic device. A front panel 76 of shelf 72 remains attached to the shelf. Top and bottom shelf panels 78, 80 together with left and right side panels 82, 84 and front panel 76 define an enclosure in which substantially no external ambient light reaches the interior of electronic device 70 except through the removed rear panel. Because racks of electronic equipment are often mounted in confined spaces such as adjacent other racks or walls, the ambient light entering the rear of the shelf 72 may be very limited and is even further restricted due to shadows cast by the repair technician as the repair technician positions himself close to the open rear of the shelf in order to see and/or reach into the shelf to gain access to the electronic device 70.

The exemplary electronic device 70 may include a power supply 86 coupled to a printed circuit board 88 that is also coupled to an external module 90. The power supply 86 is mounted to the left sidewall 82; the printed circuit board 88 is mounted to the bottom shelf panel 80; the external module 90 is mounted to the right side panel 84. A series of LEDs 92 are mounted to the front panel 76 and provide visual status indicators concerning the conditions and functions associated with electronic device 70. Although LEDs 92 are primarily intended to project light outwardly from the front panel, some of the light associated with these LEDs is radiated in the interior of electronic device 70. The power supply 86 also includes LEDs 94 designed to provide the repair technician with status information. Additional LEDs on the printed circuit board 88 as represented by exemplary LED 96 provide further status information. An LED 98 associated with external module 90 also provides status information concerning the external module. The plurality of LEDs associated with electronic device 70 that project some or substantially all of their light output within the interior of device 70 provide a relatively low, but useful, level of illumination to help the repair technician visually inspect and troubleshoot the electronic device 70.

Luminescent material is utilized in accordance with an implementation of the present invention to further assist the repair technician in visually inspecting and troubleshooting electronic device 70. Label 100 on the power supply 86, label 102 on the printed circuit board 88, and a label 104 on the external module 90 may be made of paper or plastic with indicia disposed on the visible surface of the labels made utilizing a luminescent material. This indicia may consist of text and/or symbols that provide information to the repair technician such as warnings or instructions concerning the operation or tests that can be performed to isolate a fault. Utilizing luminescent material for this indicia makes reading this information relatively easy for the repair technician even in the relatively low light environment of electronic device 70. Substantially the entire back of each label may be mounted to an associated surface such as by use of an adhesive such as for labels 101 and 102. Label 104 is attached only along one edge of the label so that the unattached remainder of this label can be twisted or moved by the repair technician to an angle relative to the interior light available inside the electronic device making reading the indicia on label 104 easier.

Figure 7:
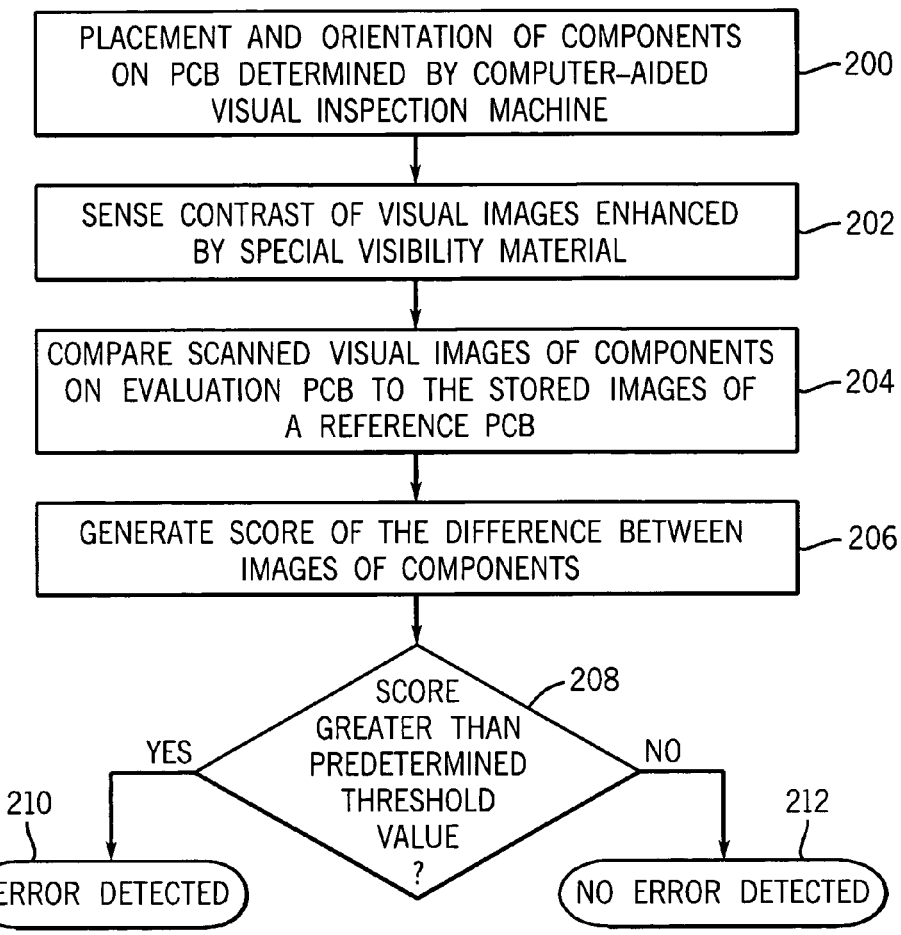
FIG. 7 is a flow diagram of an exemplary implementation of a method for detecting placement and orientation errors of components on printed circuit board.

FIG. 7 illustrates steps of an exemplary method for detecting placement and orientation errors of components on a printed circuit board (PCB). In step 200, the placement and orientation of components on a PCB are determined by a computer-aided visual inspection machine. In step 202 the computer-aided visual inspection machine senses the contrast of the visual images as enhanced by special visibility material, preferably blacklight sensitive material, disposed on the PCB adjacent and preferably substantially surrounding each component. The scanned visual images of components on a PCB to be evaluated in the presence of a blacklight source are compared with stored images on a reference PCB on which components are known to have had correct placement and orientation in step 204. A score of the difference between these images of the evaluation components and the components on the reference PCB are generated in step 206. The determination is made in step 208 of whether the score is greater a predetermined threshold value. A YES determination by step 208 results in an error being detected as indicated by step 210. A NO determination by step 208 represents no error being detected as per step 212.

Figure 8:
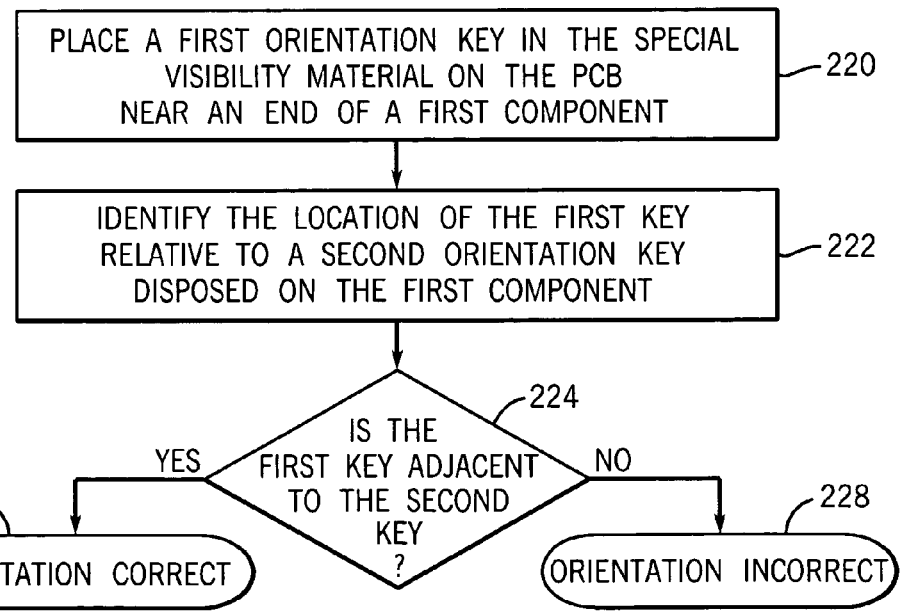
FIG. 8 is a flow diagram of another implementation of a method for determining proper component orientation of a component on printed circuit board based on a comparison of a key on the component with a key disposed in special visibility material on the printed circuit board.

FIG. 8 illustrates steps in another exemplary method for detecting proper orientation of components based on keys. In step 220 a first orientation key is placed in the special visibility material on the PCB at a location that will be near the end a first component having the corresponding orientation. In step 222 a computer-aided visual inspection machine identifies the location of the first key relative to a second orientation key disposed on or near the end of the first component itself. In step 224 a determination is made of whether the first orientation key is adjacent the second orientation key. A YES determination by step 224 results in the orientation been determined as being correct as indicated in step 226. A NO determination by step 224 results in the detection of an incorrect orientation as indicated by step 228.

Figure 9:
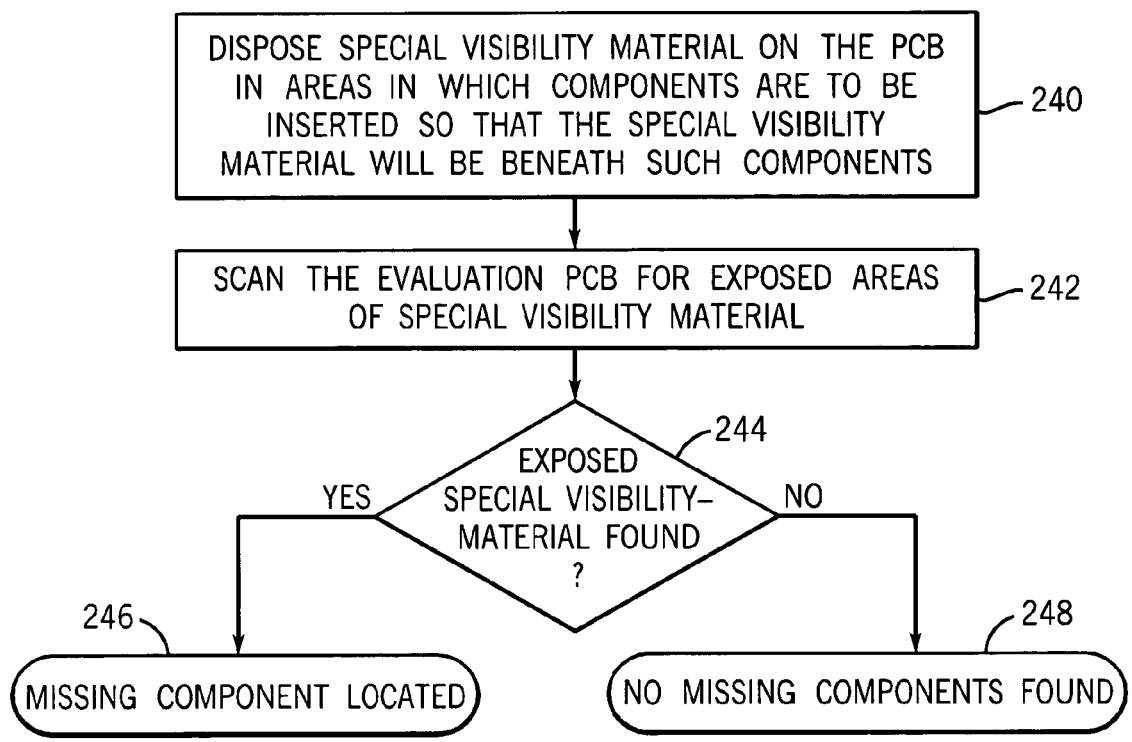
FIG. 9 is a flow diagram of a further implementation of a method in which special visibility material disposed only under components is used in identifying missing components on the printed circuit board.

FIG. 9 illustrates steps in a further exemplary method more specifically directed to locating missing components on a PCB. In step 240 special visibility material is disposed on the PCB only in areas in which components are to be inserted so that the special visibility material will be beneath such components when inserted. In step 242 a computer-aided visual inspection machine scans an evaluation PCB for exposed areas of special visibility material which will have a substantial image contrast to other areas of the PCB that do not contain special visibility material. In accordance with step 244, the determination is made of whether exposed special visibility material has been found. A YES determination by step 244 results in the determination that a missing component has been located in step 246. A NO determination by step 244 indicates that no missing components have been found as per step 248.

In accordance with the above methods it will be apparent to those skilled in the art that the computer-aided visual inspection machine can be utilized to produce various outputs and signals indicative of the various tests. These outputs can be utilized by a repair technician to correct any defects found in the printed circuit boards. The use of special visibility material provides enhanced image contrasts which results in less complex algorithms required by the computer-aided visual inspection machines in order to implement the required tests and comparisons.

The steps or operations described herein are just exemplary. There may be many variations to these steps or operations without departing from the spirit of the invention. For instance, the steps may be performed in a differing order, or steps may be added, deleted, or modified.

Although exemplary implementations of the invention have been depicted and described in detail herein, it will be apparent to those skilled in the relevant art that various modifications, additions, substitutions, and the like can be made without departing from the spirit of the invention. Some special visibility material may be better suited to some applications. For example, luminescent material is especially useful for labels and instructions for repair under low light conditions. Blacklight sensitive material is well suited for use during manufacturing to enhance the ability to locate misloads of components. Infrared sensitive material is suited for use in tracking assemblies such as repaired assemblies where the ability to track the assemblies is beneficial, but may not be desirable to display such tracking information to the end customer. The above discussed modifications are offered merely as examples of possible changes that can be made and are not to be considered a listing of all possible changes. The scope of the invention is defined in the following claims.

What is claimed is:

1. A method for locating errors in component placement on a printed circuit board comprising the steps of:
    utilizing a computer-aided visual inspection machine to determine the placement and orientation of components on the printed circuit board;
    enhancing contrast of visual images as sensed by the computer-aided visual inspection machine between components and the printed circuit board by disposing special visibility material on the printed circuit board at least in regions surrounding the components;
    comparing the enhanced contrast visual images of a printed circuit board being evaluated to stored enhanced contrast visual images of a reference printed circuit board having previously determined correct component placement and orientation;
    generating scores reflecting the difference between the compared images of the printed circuit board being evaluated and images associated with the reference printed circuit board;
    determining that a first component on the evaluated board has a placement or orientation error if a first score corresponding to the difference between the image of the first component on the printed circuit board being evaluated and image of the first component on the reference printed circuit board exceeds a predetermined threshold value.

2. The method of claim 1 wherein the special visibility material substantially surrounds the first component.

3. The method of claim 1 wherein the special visibility material is also disposed beneath the first component.

4. The method of claim 1 further comprising the step of disposing a protective material over substantially the entirety of the surface of the printed circuit board to be evaluated, the special visibility material being disposed on top of the protective material.

5. The method of claim 1 further comprising the step of disposing a visible first key marking an orientation of the first component as part of the special visibility material associated with the first component, a visible second key being disposed on the first component to identify a specific orientation of the first component, whereby the first key provides a visual reference indicating a correct orientation of the first component when the first component is mounted in the printed circuit board so that the second key is disposed substantially adjacent the first key.

6. The method of claim 5 further comprising the step of the computer-aided visual inspection machine identifying the location of the first key and determining that the first component has a correct orientation if the location of the second key corresponds with the location of the first key.

7. The method of claim 1 further comprising the step of the computer-aided visual inspection machine identifying indicia disposed within the special visibility material adjacent the first component, where the indicia identifies the first component by a label that is unique to other labels utilized on the printed circuit board.

8. The method of claim 1 wherein the special visibility material comprises blacklight sensitive material and further includes the step projecting blacklight onto the printed circuit board.

9. A method for tracking a printed circuit board comprising the steps of:
    disposing a special visibility material on the printed circuit board;
    inserting indicia relating to the tracking of the printed circuit board as part of the special visibility material, said indicia not being visible to the human eye in the presence of normal ambient light, said indicia disposed in an area on a completed printed circuit board so as to be seen by a person and including text information related to the printed circuit board;
    projecting special visibility light corresponding to the special visibility material onto the print circuit board so that said indicia becomes visible to the human eye, thereby enabling the printed circuit board to be tracked using said indicia.

10. The method of claim 9 wherein the special visibility material comprises infrared sensitive material and the projecting step includes projecting a source of infrared light onto the print circuit board.

* * * * *

UNITED STATES PATENT AND TRADEMARK OFFICE
CERTIFICATE OF CORRECTION

| | | |
|---|---|---|
| PATENT NO. | : 7,248,355 B2 | Page 1 of 1 |
| APPLICATION NO. | : 10/939754 | |
| DATED | : July 24, 2007 | |
| INVENTOR(S) | : Thane Michael Larson | |

It is certified that error appears in the above-identified patent and that said Letters Patent is hereby corrected as shown below:

In column 8, line 40, in Claim 8, after "step" insert -- of -- .

Signed and Sealed this

First Day of July, 2008

JON W. DUDAS
*Director of the United States Patent and Trademark Office*